(12) United States Patent
Tschirhart et al.

(10) Patent No.: US 11,283,356 B2
(45) Date of Patent: Mar. 22, 2022

(54) METHOD OF ASSEMBLING A DC-DC CONVERTER

(71) Applicant: Infineon Technologies Austria AG, Villach (AT)

(72) Inventors: Darryl Tschirhart, Torrance, CA (US); Benjamim Tang, Rancho Palos Verdes, CA (US); Emil Todorov, Fremont, CA (US)

(73) Assignee: Infineon Technologies North America Corp., Milpitas, CA (US)

(*) Notice: Subject to any disclaimer, the term of this patent is extended or adjusted under 35 U.S.C. 154(b) by 0 days.

(21) Appl. No.: 17/093,812

(22) Filed: Nov. 10, 2020

(65) Prior Publication Data

US 2021/0057996 A1 Feb. 25, 2021

Related U.S. Application Data

(62) Division of application No. 14/726,009, filed on May 29, 2015, now Pat. No. 10,855,178.

(51) Int. Cl.
*H02M 3/158* (2006.01)
*H05K 1/18* (2006.01)

(52) U.S. Cl.
CPC ......... *H02M 3/158* (2013.01); *H02M 3/1588* (2013.01); *H05K 1/181* (2013.01); *H05K 2201/1003* (2013.01); *Y02B 70/10* (2013.01)

(58) Field of Classification Search
None
See application file for complete search history.

(56) References Cited

U.S. PATENT DOCUMENTS

| 5,889,387 A | 3/1999 | Massie |
| 7,880,455 B2 | 2/2011 | Wu |

(Continued)

FOREIGN PATENT DOCUMENTS

| CN | 101552119 A | 10/2009 |
| CN | 102088241 A | 6/2011 |

(Continued)

OTHER PUBLICATIONS

"High Common-Mode Voltage, Single-Supply Difference Amplifier", Analog Devices; AD8202 Datasheet, Rev. H, 2004, pp. 1-20.

(Continued)

*Primary Examiner* — Khaja Ahmad
(74) *Attorney, Agent, or Firm* — Murphy, Bilak & Homiller, PLLC

(57) ABSTRACT

A method of assembling a DC-DC converter includes: attaching first and second discrete power stage transistor dies to a first side of a substrate, the first discrete die including a high-side power transistor and the second discrete die including a low-side power transistor electrically connected to the high-side power transistor to form an output phase of the DC-DC converter; attaching an inductor to the first side of the substrate so as to electrically connect the output phase to a metal output trace on the substrate, the inductor partly covering at least one of the first and the second discrete power stage transistor dies such that each discrete power stage transistor die that is partly covered by the inductor comprises a plurality of pins that are not covered by the inductor; and visually inspecting the plurality of pins uncovered by the inductor.

22 Claims, 11 Drawing Sheets

(56) References Cited

U.S. PATENT DOCUMENTS

| | | |
|---|---|---|
| 8,004,070 B1 | 8/2011 | Chen |
| 8,471,664 B1 | 6/2013 | Huang et al. |
| 9,190,383 B2 | 11/2015 | Cho et al. |
| 9,281,739 B2 | 3/2016 | Ikriannikov |
| 9,729,059 B1 | 8/2017 | Parto |
| 9,742,304 B2 | 8/2017 | Kato et al. |
| 2003/0031339 A1 | 2/2003 | Marshall et al. |
| 2004/0140877 A1 | 7/2004 | Nakao et al. |
| 2005/0052888 A1 | 3/2005 | Takeshima et al. |
| 2005/0134420 A1 | 6/2005 | Nakao et al. |
| 2006/0279267 A1 | 12/2006 | Burton et al. |
| 2008/0284403 A1 | 11/2008 | Miranda et al. |
| 2009/0147541 A1 | 6/2009 | Shimada et al. |
| 2009/0207574 A1 | 8/2009 | Chen et al. |
| 2009/0212391 A1 | 8/2009 | Carobolante et al. |
| 2010/0085139 A1 | 4/2010 | Yan et al. |
| 2010/0133670 A1 | 6/2010 | Liu et al. |
| 2011/0134613 A1* | 6/2011 | Moussaoui ....... H01L 23/49575 361/737 |
| 2011/0205008 A1 | 8/2011 | Brennan |
| 2011/0228507 A1 | 9/2011 | Yin et al. |
| 2011/0242775 A1 | 10/2011 | Schaible et al. |
| 2012/0069529 A1 | 3/2012 | Chen et al. |
| 2013/0099886 A1 | 4/2013 | Yan et al. |
| 2013/0147559 A1 | 6/2013 | Schaffer |
| 2014/0062246 A1 | 3/2014 | Langford et al. |
| 2014/0062446 A1 | 3/2014 | Ikriannikov |
| 2014/0159054 A1 | 6/2014 | Otake et al. |
| 2014/0167900 A1 | 6/2014 | Murtagian et al. |
| 2014/0239472 A1 | 8/2014 | Jones et al. |
| 2014/0292459 A1 | 10/2014 | Andres et al. |
| 2015/0162297 A1 | 6/2015 | Cho et al. |
| 2015/0194374 A1 | 7/2015 | Ananiev |
| 2015/0200156 A1* | 7/2015 | Weld ................. H01L 23/49562 257/531 |
| 2015/0311655 A1 | 10/2015 | Han et al. |
| 2016/0005528 A1 | 1/2016 | Yan et al. |
| 2016/0163631 A1* | 6/2016 | Truax ................. G01R 31/2886 324/756.02 |
| 2016/0164417 A1 | 6/2016 | Ishii et al. |

FOREIGN PATENT DOCUMENTS

| | | |
|---|---|---|
| CN | 102254908 A | 11/2011 |
| CN | 102256443 A | 11/2011 |
| CN | 102763179 A | 10/2012 |
| CN | 103081325 A | 5/2013 |
| CN | 103227172 A | 7/2013 |
| CN | 103325783 A | 9/2013 |
| CN | 103367361 A | 10/2013 |
| CN | 103680861 A | 3/2014 |
| CN | 104051128 A | 9/2014 |
| EP | 2866533 A1 | 4/2015 |
| JP | 2004063676 A | 2/2004 |
| JP | 2005102485 A | 4/2005 |
| JP | 2005522173 A | 7/2005 |
| JP | 2008092653 A | 4/2008 |
| JP | 2008112941 A | 5/2008 |
| JP | 3147172 U | 11/2008 |
| JP | 2011019083 A | 1/2011 |
| JP | 2011193000 A | 9/2011 |
| JP | 2012109518 A | 6/2012 |
| TW | 201215261 A | 4/2012 |
| WO | 03085476 A1 | 10/2003 |
| WO | 2015074247 A1 | 5/2015 |

OTHER PUBLICATIONS

Unknown, Author, "60A Power Block Non-Isolated DC-DC Converter", Murata Power Solutions, Okami OKLP-X/60-W12A-C, Mansfield, MA, 2015, 1-12.

Unknown, Author, "Programmable Output 12-Amp iLGA SMT PoL DC-DC Converter Series", Murata Power Solutions, Okami OKL2-T/12-W12 Series, Mansfield, MA, 2014, 1-19.

Unknown, Author, "Programmable Output 3-Amp iLGA SMT PoLs", Murata Power Solutions, Okami OKL-T/3-W5 Series, Mansfield, MA, 2013, 1-17.

* cited by examiner

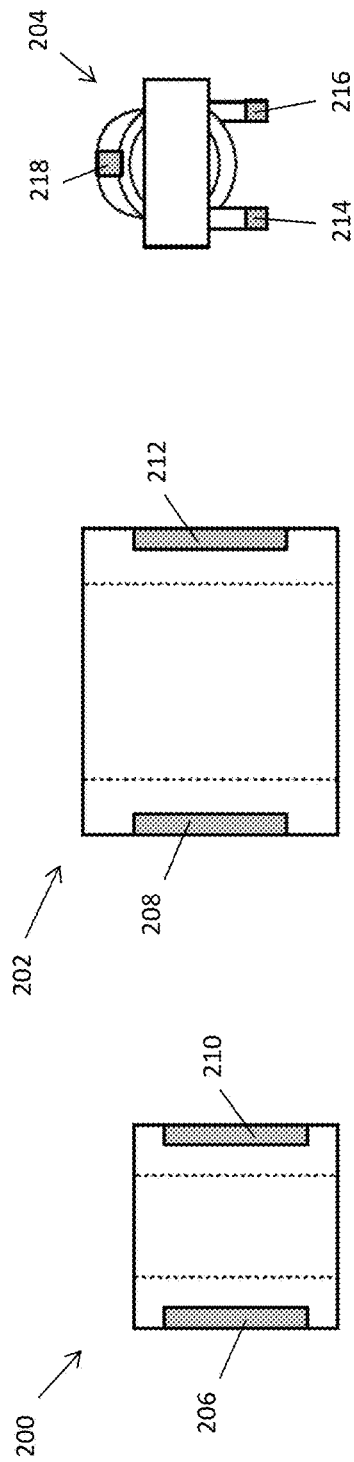
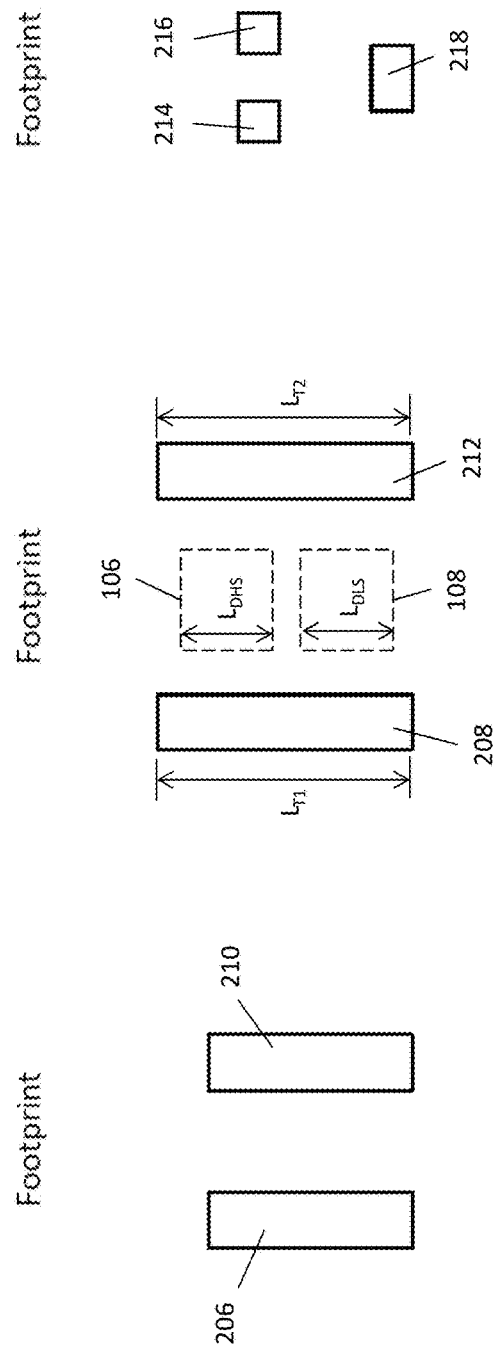
Figure 2A  Figure 2B  Figure 2C

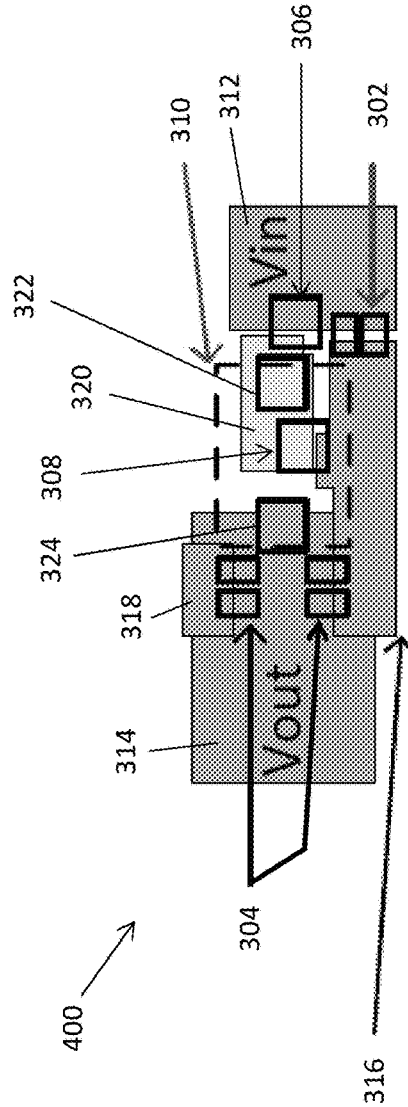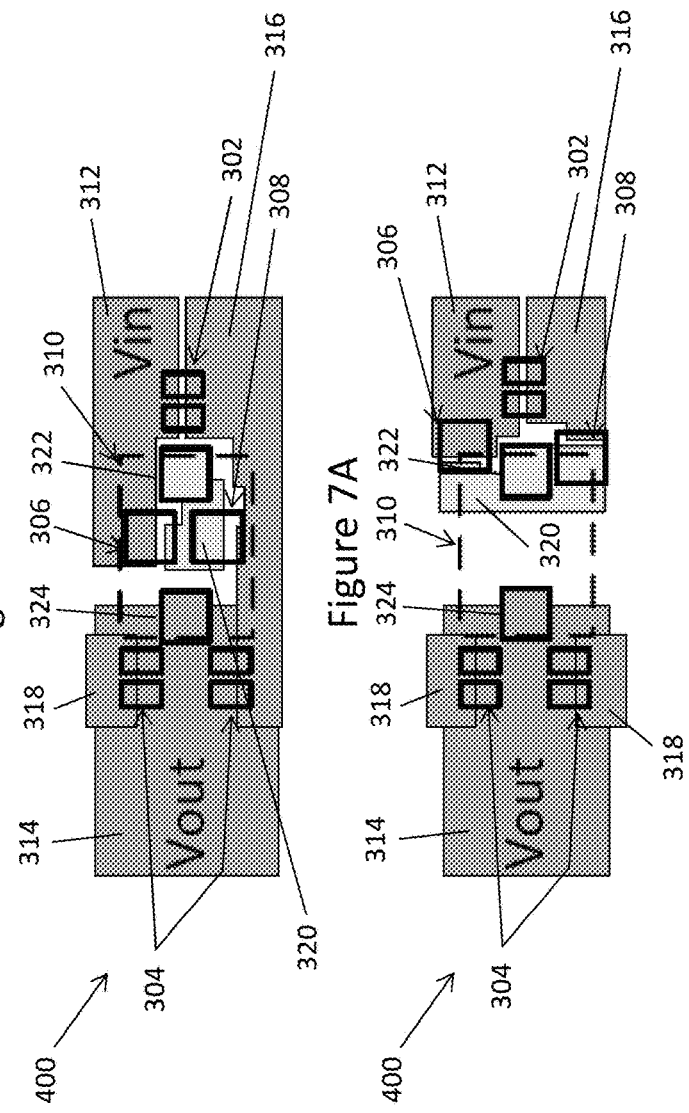

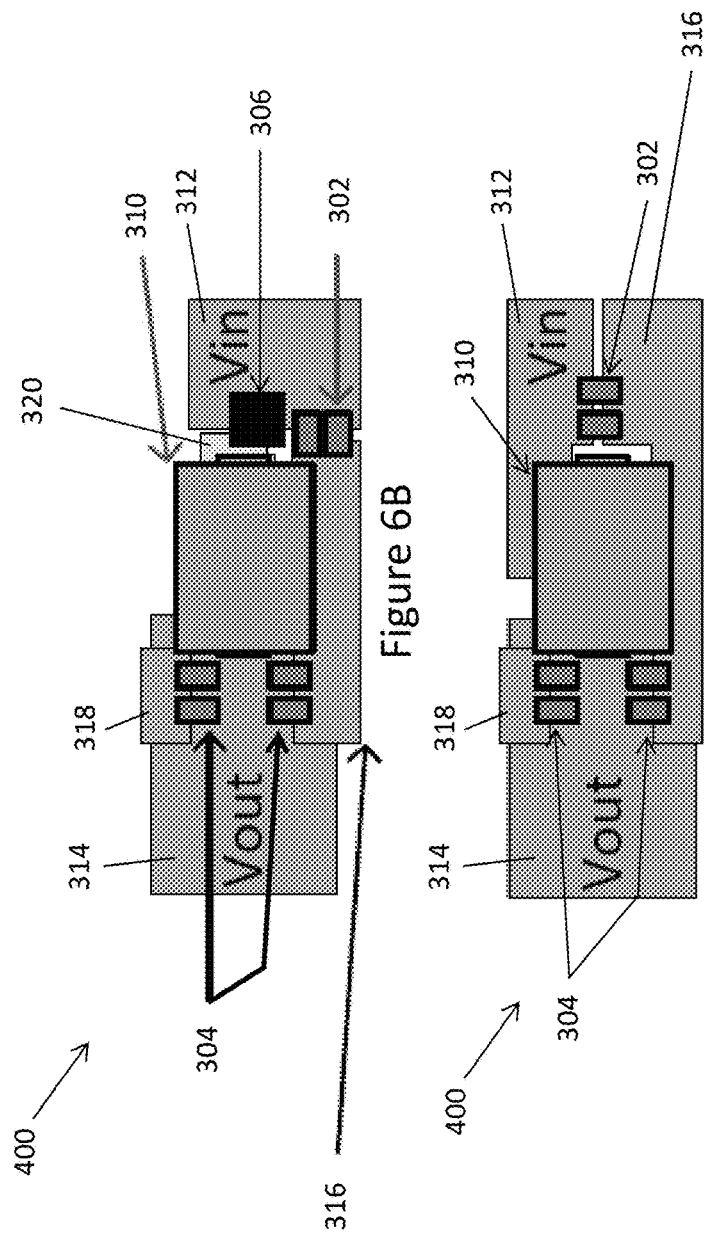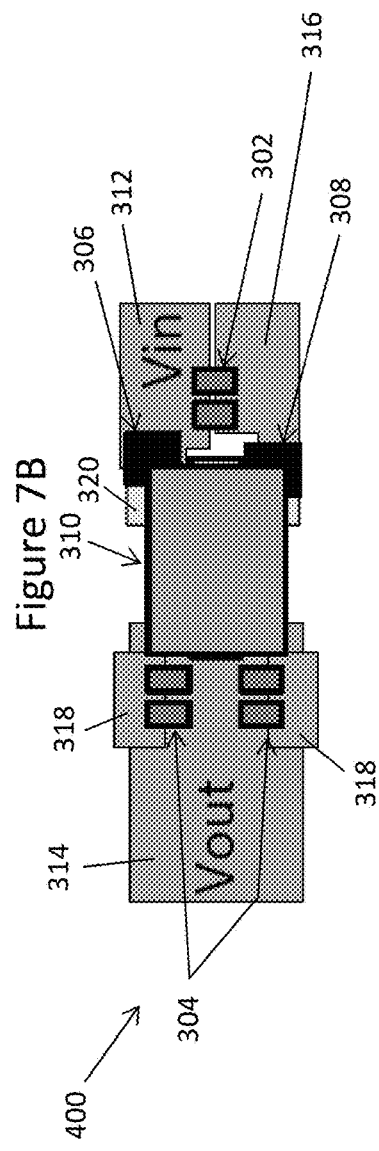

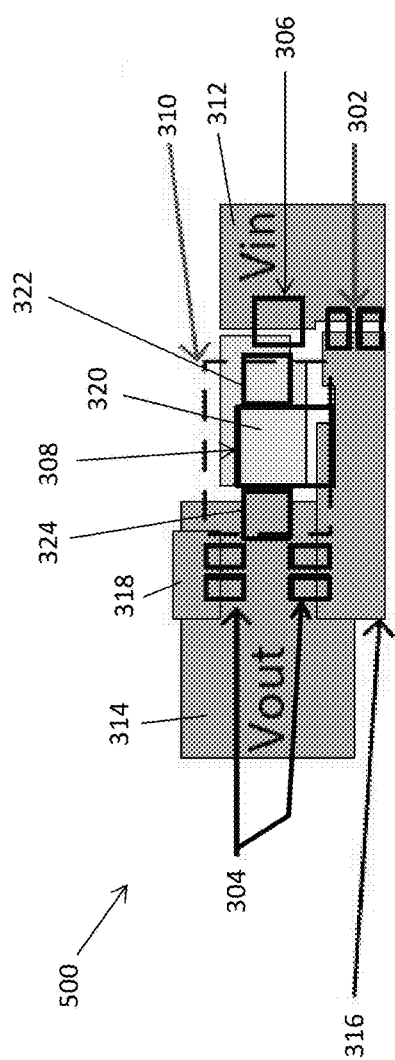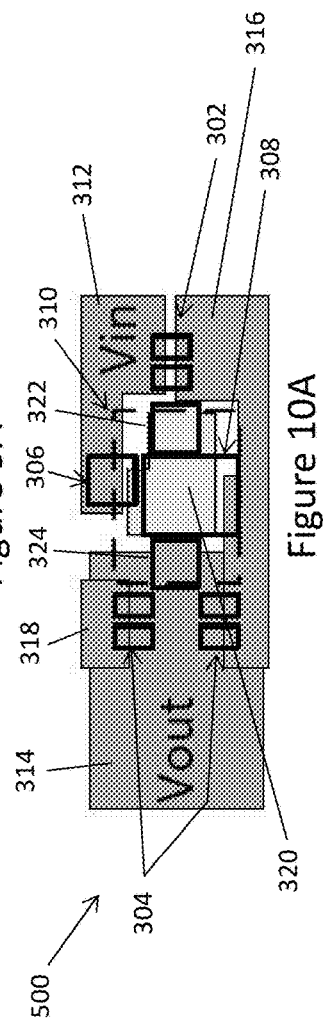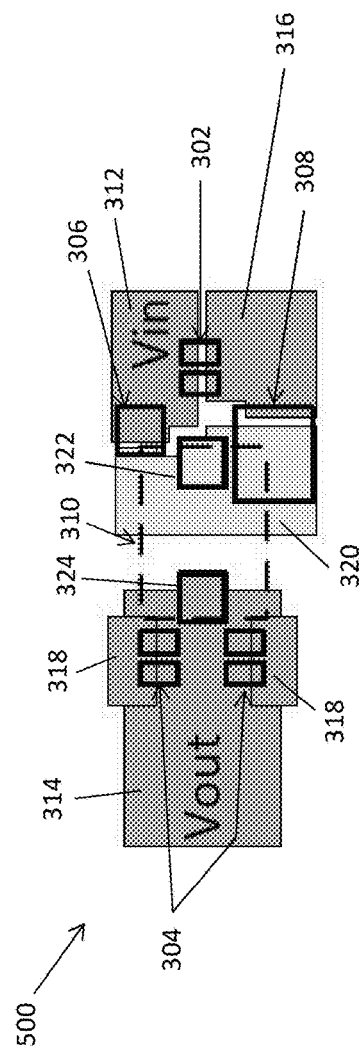

METHOD OF ASSEMBLING A DC-DC CONVERTER

TECHNICAL FIELD

The instant application relates to DC-DC converters, and more particularly to optimal placement of discrete power stage components of a DC-DC converter on a circuit board.

BACKGROUND

DC-DC converters include active and passive components, including discrete power stage components such as discrete high-side and low-side power transistor dies, for regulating the voltage of a load such as a processor. Each pair of discrete high-side and low-side power transistor dies forms an output phase of the DC-DC converter which is coupled to the load by a corresponding output inductor. The components of a DC-DC converter, including the output inductors, are attached to a printed circuit board (PCB) together with the load. The PCB has various electrical pathways for electrically interconnecting the DC-DC converter components, including electrically connecting the discrete power stage transistor dies of the converter to the load. DC-DC converter power stage dies are conventionally attached to a PCB in the same plane as the output inductors, increasing the size of the PCB. Also, conventional layout design practices for PCBs further complicate such an arrangement of the DC-DC converter components.

SUMMARY

According to an embodiment of a DC-DC converter, the DC-DC converter comprises a substrate having opposing first and second sides, a first discrete power stage transistor die attached to the first side of the substrate and comprising a high-side power transistor, and a second discrete power stage transistor die attached to the first side of the substrate and comprising a low-side power transistor electrically connected to the high-side power transistor to form an output phase of the DC-DC converter. The DC-DC converter further comprises an inductor attached to the first side of the substrate so as to electrically connect the output phase to a metal output trace on the substrate. The inductor at least partly covers at least one of the first and the second discrete power stage transistor dies.

According to an embodiment of a method of assembling a DC-DC converter, the method comprises: attaching a first discrete power stage transistor die to a first side of a substrate, the first discrete power stage transistor die comprising a high-side power transistor; attaching a second discrete power stage transistor die to the first side of the substrate, the second discrete power stage transistor die comprising a low-side power transistor electrically connected to the high-side power transistor to form an output phase of the DC-DC converter; attaching an inductor to the first side of the substrate so as to electrically connect the output phase to a metal output trace on the substrate, the inductor partly covering at least one of the first and the second discrete power stage transistor dies so that a plurality of pins of each discrete power stage transistor die partly covered by the inductor are uncovered by the inductor; and visually inspecting the plurality of pins uncovered by the inductor.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A through 2C illustrate bottom plan views of different embodiments of output (phase) inductors designed to at least partly cover one or more discrete power stage transistor dies of a DC-DC converter.

FIGS. 3A through 5A and 3B through 5B illustrate respective top-down plan views of different embodiments of a section of a substrate to which power stage components of a DC-DC converter are to be attached.

FIGS. 6A through 8A and 6B through 8B illustrate respective top-down plan views of additional different embodiments of a section of a substrate to which power stage components of a DC-DC converter are to be attached.

FIGS. 9A through 11A and 9B through 11B illustrate respective top-down plan views of yet additional different embodiments of a section of a substrate to which power stage components of a DC-DC converter are to be attached.

DETAILED DESCRIPTION

According to embodiments described herein, a DC-DC converter includes at least one pair of discrete power stage transistor dies. Each discrete power stage transistor die includes a high-side power transistor or a low-side power transistor, but not both transistors. As such, the power transistors which form the power (output) stage of the DC-DC converter are disposed in separate dies. Each discrete high-side transistor die switchably connects the load to an input voltage of the DC-DC converter, and the corresponding discrete low-side transistor die switchably connects the load to ground at different periods. The discrete dies can be bare dies i.e. unpackaged dies and have a thickness of 0.6 mm or less. In another embodiment, the discrete dies are packaged dies such as a molded die package or an open cavity die package each having a thickness of 1.1 mm or less.

In either case, each pair of discrete high-side and low-side power stage transistor dies forms an output phase of the DC-DC converter. Each output phase is coupled to the load by a respective inductor. In the case of a single pair of discrete high-side and low-side power stage transistor dies, the DC-DC converter is a single-phase converter. In the case of two or more pairs of discrete high-side and low-side power stage transistor dies, the DC-DC converter is a multi-phase converter. One or more of the discrete power stage transistor dies is at least partly covered by the inductor electrically coupled to that phase. For each discrete power stage transistor die partly covered by an inductor, a plurality of pins of that discrete die can remain uncovered by the inductor, which allows for easy visual inspection of those pins after the components of the DC-DC converter are attached to a substrate such as a circuit board.

Figure 1A:
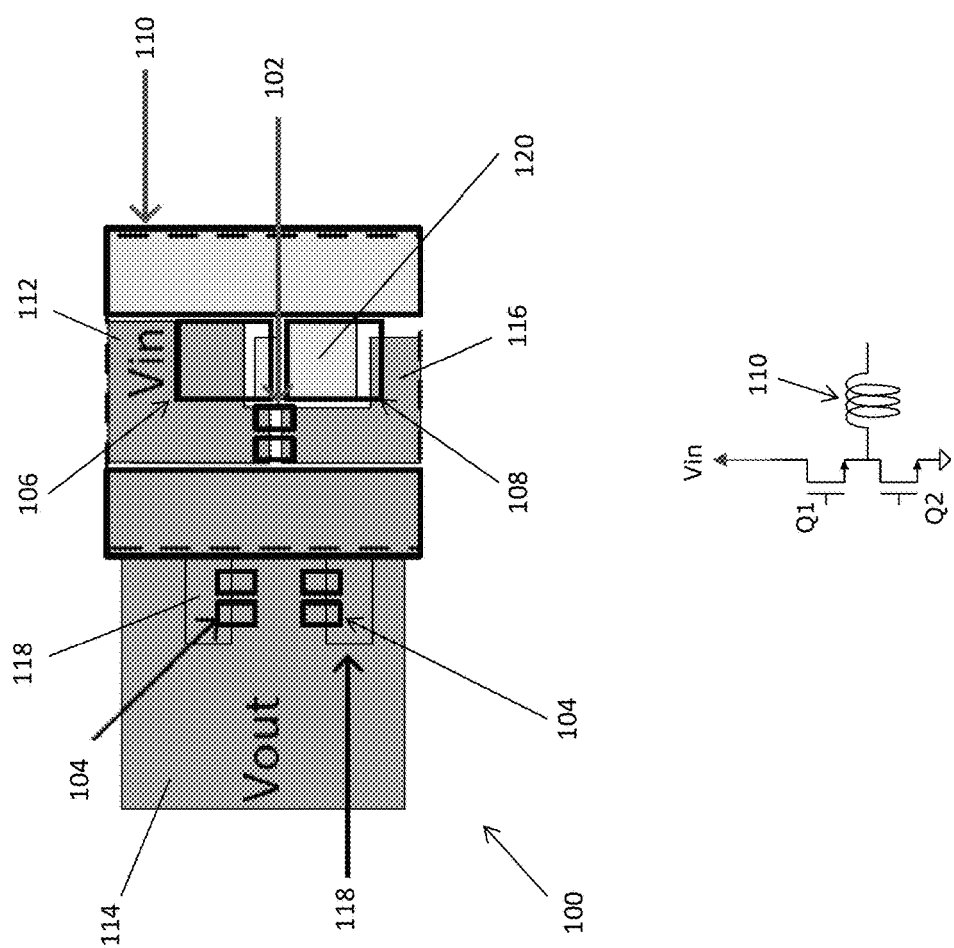
FIG. 1A illustrates a top plan view of a section of a substrate such as a PCB to which power stage components of a DC-DC converter are attached, according to an embodiment.

FIG. 1A illustrates a top-down plan view of a section of a substrate 100 such as a PCB (printed circuit board) to which power stage components of a DC-DC converter are to be attached. FIG. 1A illustrates the substrate 100 prior to attachment of the power stage components. As such, only the footprints of the power stage components are shown in FIG. 1A. The DC-DC converter can be a single-phase or a multi-phase converter as explained above. For example, the section of the substrate 100 shown in FIG. 1A can correspond to one phase of a single-phase or one phase of a multi-phase converter where the physical layout of each phase can be identical or different to what is shown in FIG. 1A for the one phase. That is, the output phase layout shown in FIG. 1A can be replicated for each phase of a multi-phase converter or the output phases can have different layouts.

The power stage components of the single-phase or multi-phase DC-DC converter include input capacitors 102, output capacitors 104, discrete high-side and low-side power transistor dies 106, 108 for each phase of the DC-DC converter, and an inductor 110 for coupling each phase to a load regulated by the DC-DC converter. The pair of discrete high-side and low-side transistor dies 106, 108 shown in FIG. 1A forms one output phase of the DC-DC converter, which is coupled to the load by the inductor 110. A circuit schematic of the phase formed by the high-side transistor Q1 included in the discrete high-side transistor die 106, the low-side transistor Q2 included in the discrete low-side transistor die 108, and the inductor 110 is shown in FIG. 1A. The load can be a high-performance integrated circuit such as a microprocessor, graphics processor, network processor, etc. or other type of integrated circuit requiring voltage regulation such as a POL (point-of-load). The load is not shown in FIG. 1A for ease of illustration.

The substrate 100 includes various metal traces such as copper traces for electrically connecting the power stage components. The metal traces are separated from one another to prevent shorting. The metal traces include an input trace 112 which is at the input voltage potential (Vin) of the DC-DC converter, an output trace 114 which is at the regulated output voltage potential (Vout) of the DC-DC converter, one or more ground traces 116, 118 connected to ground, and a phase trace 120.

The input capacitors 102 of the power stage are connected between the input trace 112 and one of the ground traces 116. The output capacitors 104 of the power stage are connected between the output trace 114 and one of the ground traces 118. The input side of the discrete high-side transistor die 106 is connected to the input trace 112, so that the high-side transistor Q1 included in the discrete high-side transistor die 106 can switchably connect the load to the input voltage Vin of the DC-DC converter. The input side of the discrete low-side transistor die 108 is connected to one of the ground traces 116, so that the low-side transistor Q2 included in the discrete low-side transistor die 108 can switchably connect the load to ground at different periods than the high-side transistor Q1 is active. The output side of both discrete transistor dies 106, 108 are connected to the phase trace 120. One terminal of the inductor 110 is attached to the phase trace 120 and the other terminal of the inductor 110 is attached to the output trace 114, so that the output sides of the discrete transistor dies 106, 108 are electrically connected to the output trace 114 on the substrate 100 through the inductor 110.

Figure 1B:
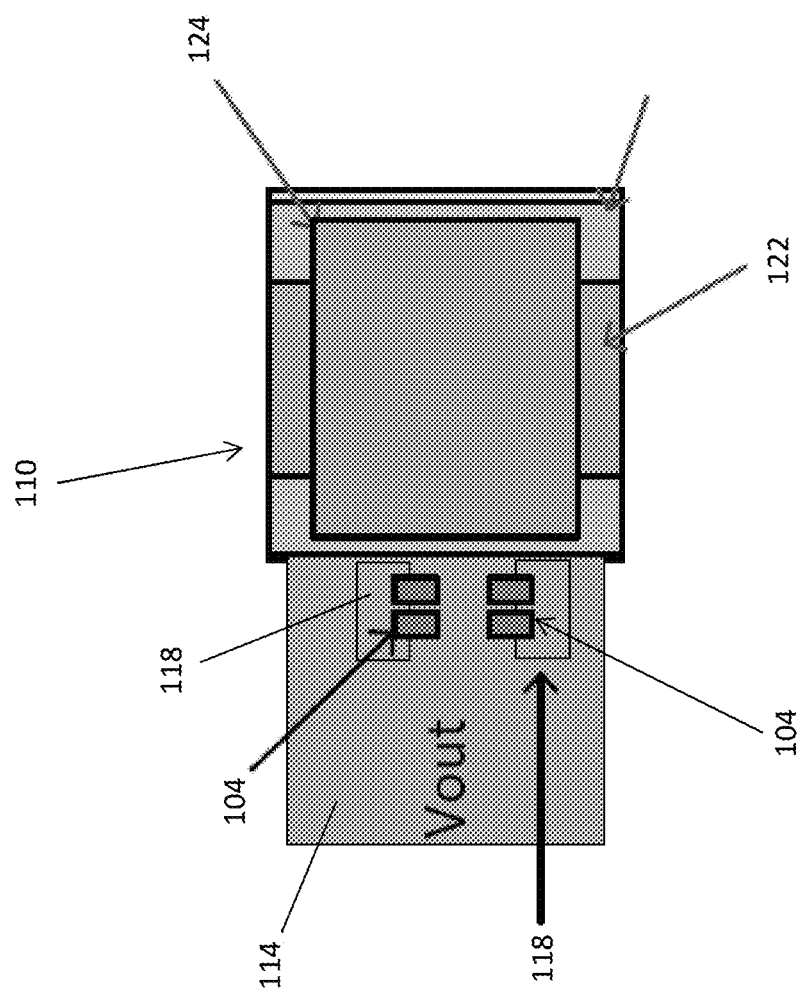
FIG. 1B shows the substrate of FIG. 1A after the power stage components of the DC-DC converter are attached to the substrate.

FIG. 1B shows the substrate 100 after the power stage components of the DC-DC converter are attached to the substrate 100. According to this embodiment, the inductor 110 completely covers both discrete power stage transistor dies 106, 108. This means that the inductor 110 and the discrete power stage transistor dies 106, 108 have overlapping footprints so that when the inductor 110 is attached to the substrate 100, the inductor 110 provides sufficient clearance such that both discrete power stage transistor dies 106, 108 are underneath and fully or partly covered by the inductor 110. In one embodiment, the metal ground trace 116 to which the discrete low-side transistor die 108 is connected, the input trace 112 and the phase trace 120 are each completely covered by the inductor 110 as shown in FIG. 1B.

Figure 1C:
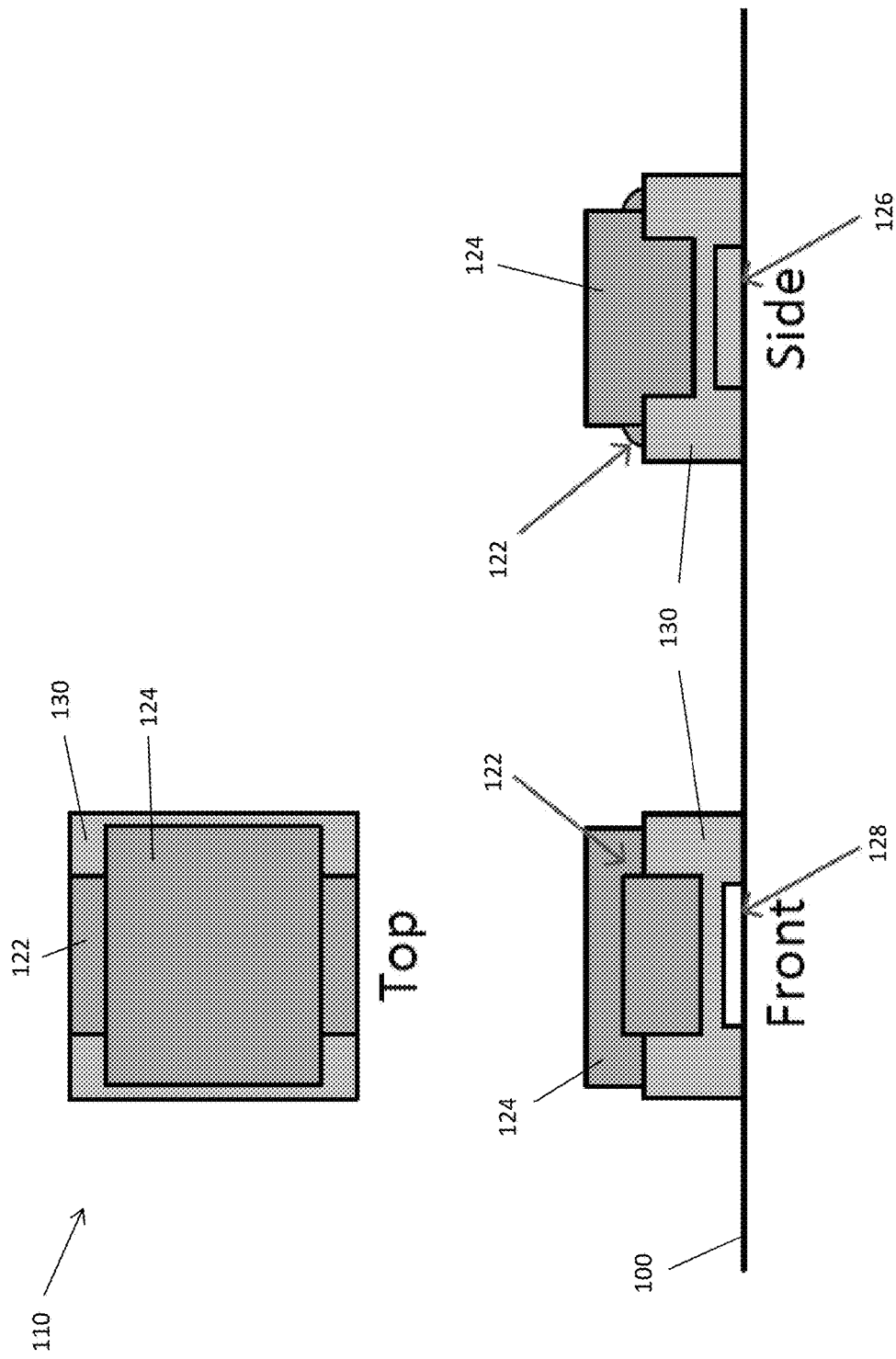
Figure 3A:
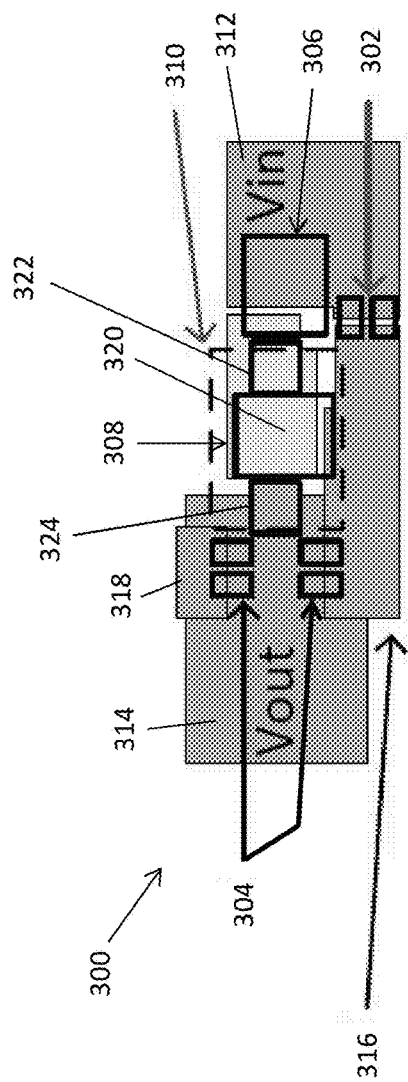
Figure 4A:
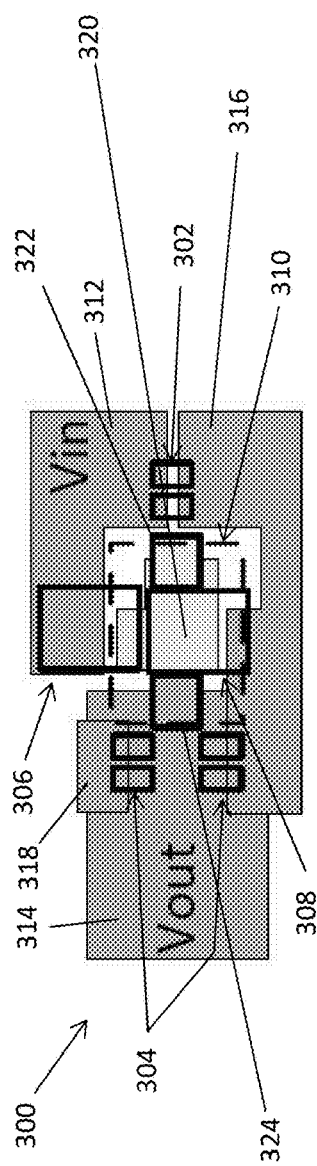

FIG. 1C shows a top view, side view and front view of the inductor 110. The inductor 110 is a single inductor according to this embodiment which comprises a single winding 122 wound on a core 124. The single winding 122 electrically connects the phase trace 120 to the output trace 114 of the substrate 100. More particularly, the inductor 110 comprises a first terminal 126 electrically connected to the phase trace 120 and therefore to the output phase formed by the discrete high-side and low-side transistor dies 106, 108. A second terminal (out of view) of the inductor 110 is attached to the output trace 114. The single winding 122 of the inductor 110 e.g. a copper foil winding is connected between the first and second terminals and forms part of the main body of the inductor 110. The main body of the inductor 110 is spaced apart from the substrate 100 by a gap 128. In one embodiment, the main body of the inductor 110 also comprises a plastic riser 130 for providing clearance 128 under inductor 110. This clearance 128 provides the gap between the inductor 110 and the substrate 100 for accommodating at least one of the discrete power stage transistor dies 106, 108 under the inductor 110. In FIG. 1B, both discrete power stage transistor dies 106, 108 are disposed in the gap 128 and completely covered by the inductor 110. In one embodiment, the bottom surface of the inductor 110 facing the substrate 100 is spaced apart from the top surface of each discrete power stage transistor die 106, 108 at least partly covered by the inductor 110 by at least 0.1 mm.

FIGS. 2A through 2C illustrate bottom plan view of different embodiments of output (phase) inductors 200, 202, 204 designed to at least partly cover one or more discrete power stage transistor dies of a DC-DC converter. The footprint of the respective inductors 200, 202, 204 also is shown in FIGS. 2A through 2C, the footprint corresponding to the amount of space on the substrate needed for attaching the respective inductors 200, 202, 204 to the substrate. In FIGS. 2A and 2B, just the two terminals 206/208, 210/212 of the corresponding inductor 200/202 are attached to the substrate. The terminals 208, 212 of the inductor 202 shown in FIG. 2B are longer than the terminals 206, 210 of the inductor 200 shown in FIG. 2A. In one embodiment, the lengths $L_{T1}$, $L_{T2}$ of the first and second terminals 208, 212 of the inductor 202 in FIG. 2B are individually longer than the combined length ($L_{DHS}+L_{DLS}$) of the discrete high-side and low-side power stage transistor dies 106, 108. The discrete high-side and low-side transistor dies 106, 108 are illustrated with respective dashed boxes in FIG. 2B to show the corresponding die footprint in relation to the length of the inductor terminals 208, 212. The terminals 214, 216 of the inductor 204 shown in FIG. 2C are substantially shorter than the terminals 206/208, 210/212 of the respective inductors 200/202 shown in FIGS. 2A and 2B. Also, the inductor 204 shown in FIG. 2C has an additional post 218 for stabilizing the inductor 204 after attachment to a substrate.

FIGS. 3A through 5A and 3B through 5B illustrate respective top-down plan views of different embodiments of a section of a substrate 300 such as a PCB (printed circuit board) to which power stage components of a DC-DC converter are to be attached. FIGS. 3A through 5A illustrate the respective substrate sections prior to assembly of the power stage components, and FIGS. 3B through 5B illustrate the same substrate sections after power stage component attachment. As such, FIGS. 3A through 5A show only the footprints of the power stage components. The DC-DC converter can be a single-phase or a multi-phase converter and the power stage components of the DC-DC converter include input capacitors 302, output capacitors 304, discrete high-side and low-side power transistor dies 306, 308 for each phase of the DC-DC converter, and an inductor 310 for coupling each phase to a load regulated by the DC-DC converter as previously explained herein.

The substrate 300 includes various metal traces such as copper traces for electrically connecting the power stage components. The metal traces are separated from one another to prevent shorting. The metal traces include an input trace 312 which is at the input voltage potential (Vin) of the DC-DC converter, an output trace 314 which is at the regulated output voltage potential (Vout) of the DC-DC converter, one or more ground traces 316, 318 connected to ground, and a phase trace 320 also as previously described herein.

The input capacitors 302 of the power stage are connected between the input trace 312 and one of the ground traces 316. The output capacitors 304 of the power stage are connected between the output trace 314 and one of the ground traces 318. The discrete high-side transistor die 306 is electrically connected between the input trace 312 and the phase trace 320. The discrete low-side transistor die 308 is electrically connected between one of the ground traces 316 and the phase trace 320. One terminal 322 of the inductor 310 is attached to the phase trace 320 and the other terminal 324 is attached to the output trace 314, so that the outputs of the discrete transistor dies 306, 308 are electrically connected to the output trace 314 on the substrate 300 through the inductor 310.

Figure 3B:
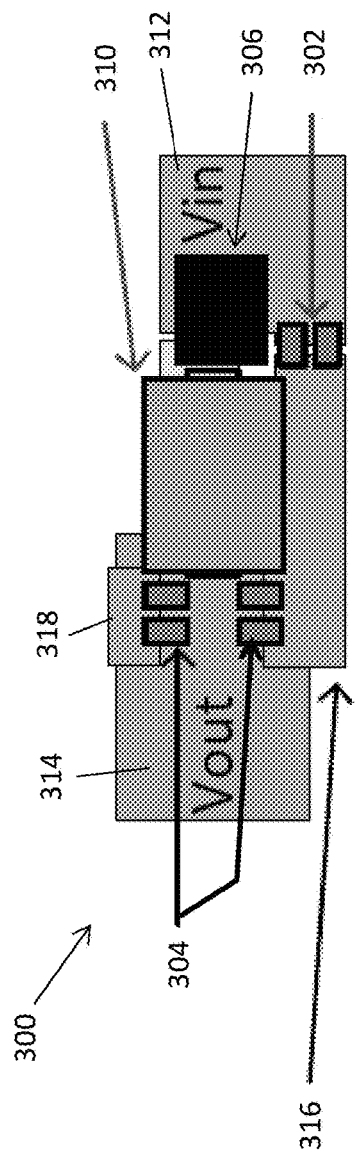

In FIG. 3B, the inductor 310 completely covers the discrete low-side transistor die 308 and does not cover any part of the discrete high-side transistor die 306. According to one embodiment, the discrete low-side transistor die 308 is disposed in the gap between the main body of the inductor 310 and the substrate 300 as previously described herein.

Figure 4B:
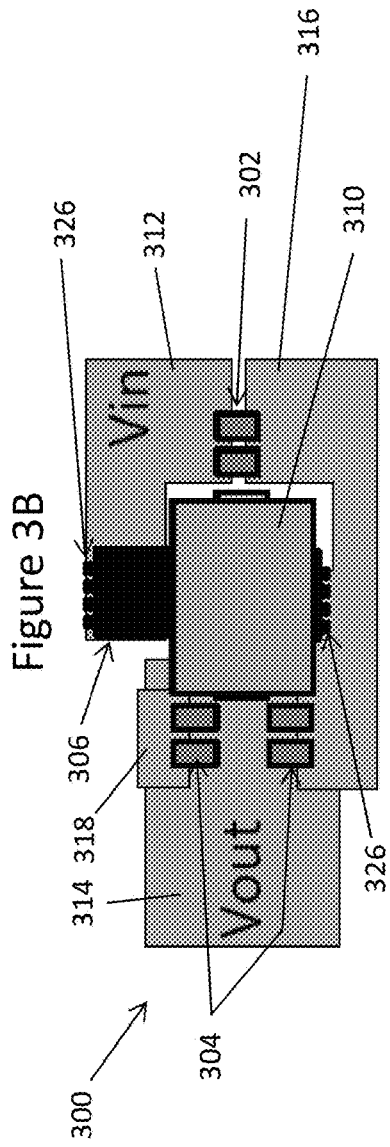

In FIG. 4B, the inductor 310 at least partly covers both discrete transistor dies 306, 308. According to one embodiment, the discrete high-side transistor die 306 is partly covered by the inductor 310 and the discrete low-side transistor die 308 is completely covered by the inductor 310. This way, the pins 326 of each discrete high-side transistor die 306, 308 which remain uncovered by the inductor 310 can be visually inspected without interference from the inductor 310.

Figure 5A:
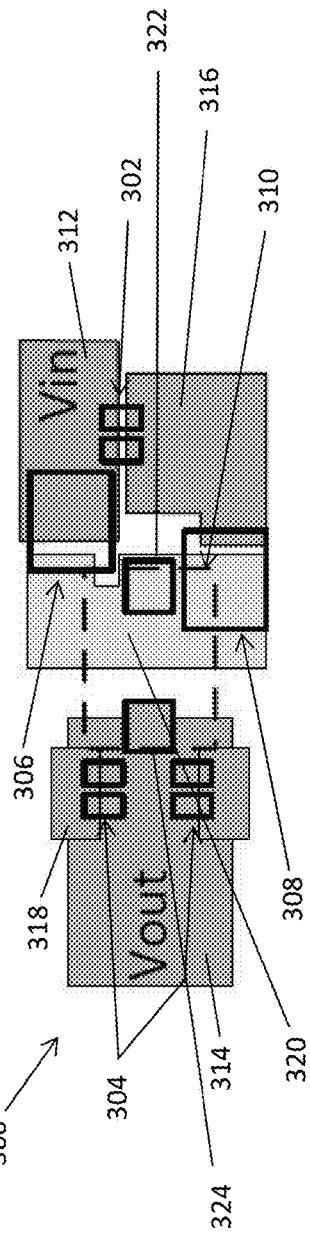
Figure 5B:
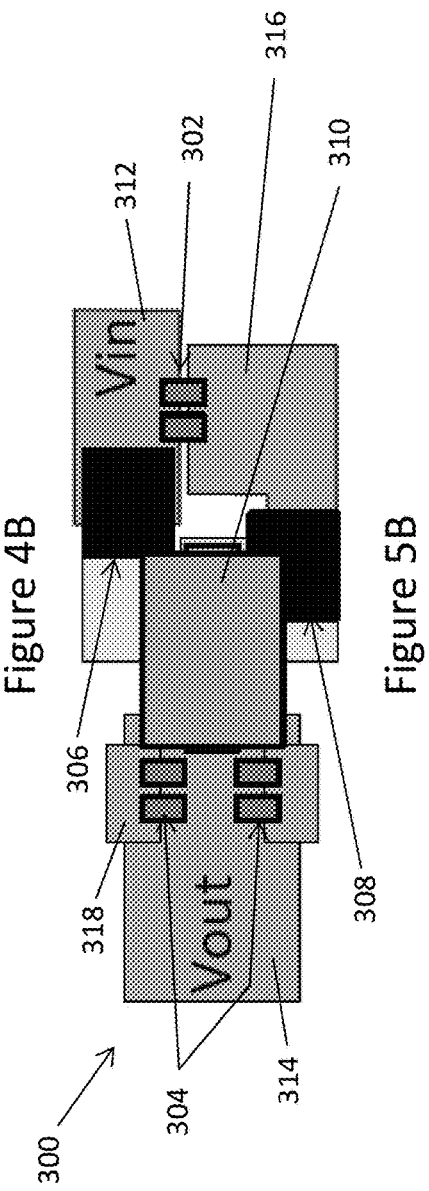
Figure 9B:
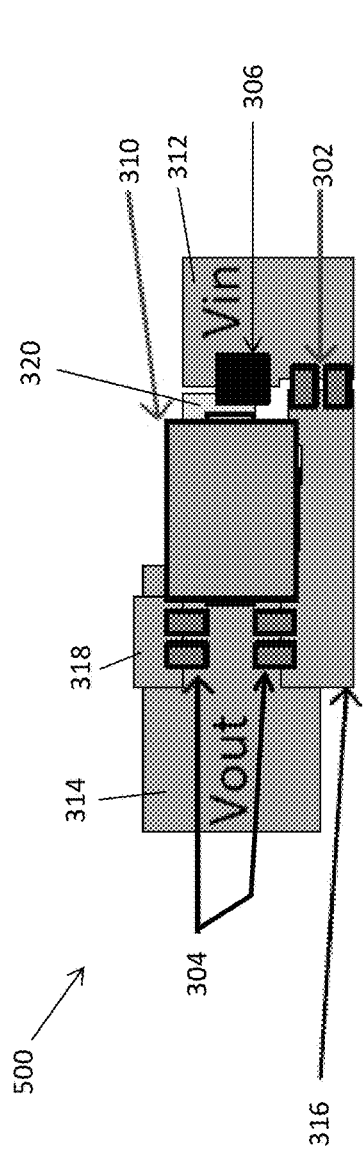
Figure 10B:
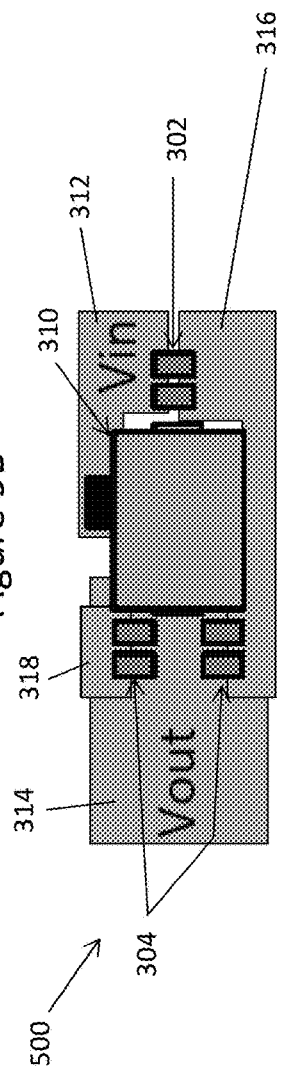
FIG. 10 shows top, front and side views of the power stage inductor attached to the substrate shown in FIG. 1B.
Figure 11B:
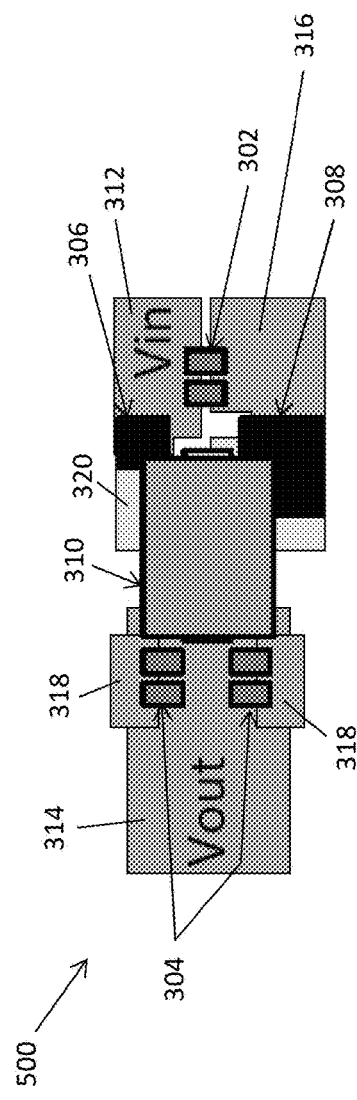

In FIG. 5B, the inductor 310 partly covers the discrete low-side transistor die 308 and does not cover any part of the discrete high-side transistor die 306. In both FIGS. 3B and 4B, the discrete low-side transistor die 308 is disposed between the terminals 322, 324 of the inductor 310. In FIG. 5B, the discrete low-side transistor die 308 is disposed adjacent to one of the inductor terminals 322, but not between the inductor terminals 322, 324. In FIGS. 3B and 5B, the phase trace 320 extends under the inductor 310. In FIGS. 3B and 4B, one of the ground traces 316 extends under the inductor 310. Also, the discrete low-side transistor die 308 is attached to both this ground trace 316 and the phase trace 320 in a first region of the substrate 300 disposed under the inductor 310.

FIGS. 6A through 8A and 6B through 8B illustrate respective top-down plan views of additional different embodiments of a section of a substrate 400 such as a PCB (printed circuit board) to which power stage components of a DC-DC converter are to be attached. FIGS. 6A through 8A illustrate the respective substrate sections prior to assembly of the power stage components, and FIGS. 6B through 8B illustrate the same substrate sections after power stage component attachment. As such, FIGS. 6A through 8A show only the footprints of the power stage components. The DC-DC converter can be a single-phase or a multi-phase converter and the power stage components of the DC-DC converter include input capacitors 302, output capacitors 304, discrete high-side and low-side power transistor dies 306, 308 for each phase of the DC-DC converter, and an inductor 310 for coupling each phase to a load regulated by the DC-DC converter as previously explained herein.

The transistor die orientations shown in FIGS. 6A through 8A and 6B through 8B are similar to those shown in FIGS. 3A through 5A and 3B through 5B, respectively. Different however, one or more of the substrate metal traces shown in FIGS. 6A through 8A and 6B through 8B have different layout configurations as compared to the respective layouts shown in FIGS. 3A through 5A and 3B through 5B. For example in FIGS. 7A and 7B, the input trace 312 extends under the inductor 310 and the discrete high-side transistor die 306 is attached to both the input trace 312 and the phase trace 120 in a second region of the substrate 400 disposed under the inductor 310, the second region being different than the first region shown in FIGS. 4A and 4B. In FIGS. 8A and 8B, both discrete transistor dies 306, 308 are disposed in the gap and adjacent to the first terminal 322 of the inductor 310. In FIGS. 5A and 5B, only the discrete low-side transistor die 308 is disposed in the gap and adjacent to the first terminal 322 of the inductor 310. The discrete high-side transistor die 308 remains completely uncovered by the inductor 310 in FIG. 5B.

FIGS. 9A through 11A and 9B through 11B illustrate respective top-down plan views of yet additional different embodiments of a section of a substrate 500 such as a PCB (printed circuit board) to which power stage components of a DC-DC converter are to be attached. FIGS. 9A through 11A illustrate the respective substrate sections prior to assembly of the power stage components, and FIGS. 9B through 11B illustrate the same substrate sections after power stage component attachment. As such, FIGS. 9A through 11A show only the footprints of the power stage components. The DC-DC converter can be a single-phase or a multi-phase converter and the power stage components of the DC-DC converter include input capacitors 302, output capacitors 304, discrete high-side and low-side power transistor dies 306, 308 for each phase of the DC-DC converter, and an inductor 310 for coupling each phase to a load regulated by the DC-DC converter as previously explained herein.

The transistor die orientations and metal trace layouts shown in FIGS. 9A through 11A and 9B through 11B are similar to those shown in FIGS. 6A through 8A and 6B through 8B, respectively. Different however, the discrete low-side transistor die 308 shown in FIGS. 9A through 11A and 9B through 11B have a physically larger size than the discrete high-side transistor die 306.

Various types of inductors can be used as the output phase inductor of a DC-DC converter and which partly covers at least one of the discrete transistor dies that form that phase. For example in FIG. 3C, a single winding inductor 110 is shown.

Figure 12:
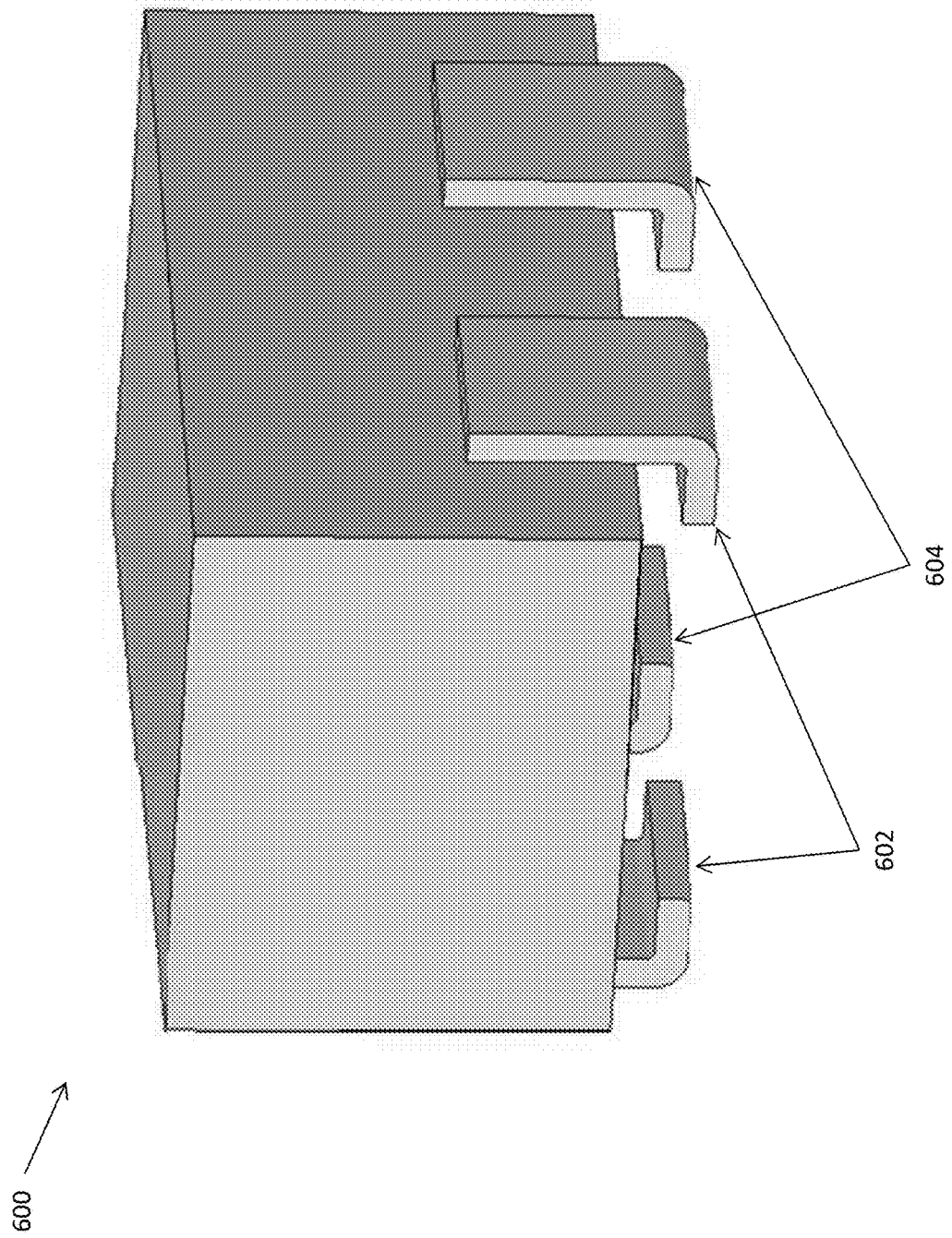
FIG. 12 illustrates a side perspective view of a coupled inductor designed to at least partly cover one or more discrete power stage transistor dies of a DC-DC converter.

FIG. 12 shows a perspective view of a coupled inductor 600 which can replace two or more single winding phase inductors of a DC-DC converter. The coupled inductor 600 comprises two or more separate windings (out of view) wound on the same core (also out of view). Each separate winding has a pair of terminals 602, 604 for attachment to corresponding metal traces on a substrate, and is associated with one phase of a multi-phase DC-DC converter. That is, each separate winding electrically connects one output phase of a multi-phase DC-DC converter to the output trace of a substrate. This way, more than one phase can be realized using a single coupled inductor. Alternatively, one or more of the inductors can comprise separate uncoupled windings wound on the same core, and each of the separate uncoupled windings electrically connects one output phase to the output trace of the substrate. In each case, the inductor 600 at least partly covers at least one discrete power stage transistor die of a DC-DC converter. Based on the coupled inductor design shown in FIG. 12, one or both discrete power stage transistor dies of at least two phases of a multi-phase DC-DC converter can be disposed between the terminals 602, 604 of the coupled inductor and at least partly covered by the coupled inductor 600.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of assembling a DC-DC converter, the method comprising:
    attaching a first discrete power stage transistor die to a first side of a substrate, the first discrete power stage transistor die comprising a high-side power transistor;
    attaching a second discrete power stage transistor die to the first side of the substrate, the second discrete power stage transistor die comprising a low-side power transistor electrically connected to the high-side power transistor to form an output phase of the DC-DC converter;
    attaching an inductor to the first side of the substrate so as to electrically connect the output phase to a metal output trace on the substrate, the inductor partly covering at least one of the first and the second discrete power stage transistor dies such that each discrete power stage transistor die that is partly covered by the inductor comprises a plurality of pins that are not covered by the inductor; and
    visually inspecting the plurality of pins uncovered by the inductor.

2. The method of claim 1, wherein the inductor is attached to the first side of the substrate such that the inductor partly covers both the first discrete power stage transistor die and the first discrete power stage transistor die.

3. The method of claim 1, wherein the inductor is attached to the first side of the substrate such that one of the first and the second discrete power stage transistor dies is partly covered by the inductor and the other one of the first and the second discrete power stage transistor dies is at least partly covered by the inductor.

4. The method of claim 1, wherein the inductor is attached to the first side of the substrate such that one of the first and the second discrete power stage transistor dies is partly covered by the inductor and the other one of the first and the second discrete power stage transistor dies is completely uncovered by the inductor.

5. The method of claim 1, wherein the inductor is a single inductor comprising a single winding wound on a core, and wherein the single winding electrically connects the output phase to the metal output trace.

6. The method of claim 1, wherein the inductor is a coupled inductor comprising separate windings wound on the same core, and wherein each of the separate windings electrically connects one output phase to the metal output trace.

7. The method of claim 1, wherein the inductor comprises a first terminal, a second terminal, and a winding connected between the first and the second terminals and which forms part of a main body of the inductor, and wherein attaching the inductor to the first side of the substrate comprises:
    attaching the first terminal of the inductor to the output phase;
    attaching the second terminal of the inductor to the metal output trace,
    wherein the main body of the inductor is spaced apart from the substrate by a gap, and
    wherein at least one of the first and the second discrete power stage transistor dies is attached to the first side of the substrate such that the at least one of the first and the second discrete power stage transistor dies is disposed in the gap.

8. The method of claim 7, wherein the first and the second discrete power stage transistor dies are attached to the first side of the substrate such that both the first discrete power stage transistor die and the second discrete power stage transistor die are disposed in the gap.

9. The method of claim 7, wherein the first and the second terminals of the inductor are individually longer than a combined length of the first and the second discrete power stage transistor dies.

10. The method of claim 7, wherein at least one of the first and the second discrete power stage transistor dies is attached to the first side of the substrate such that the at least one of the first and the second discrete power stage transistor dies is disposed between the first and the second terminals of the inductor.

11. The method of claim 7, wherein the first and the second discrete power stage transistor dies are attached to the first side of the substrate such that both the first discrete power stage transistor die and the second discrete power stage transistor die are disposed in the gap and are adjacent to the first terminal of the inductor.

12. The method of claim 7, wherein the first and the second discrete power stage transistor dies are attached to the first side of the substrate such that:
    the first discrete power stage transistor die is connected between a metal input voltage trace on the substrate and a metal output phase trace on the substrate, the metal output phase trace being electrically connected to the output phase;
    the second discrete power stage transistor die is connected between a metal ground trace on the substrate and the metal output phase trace;
    the first terminal of the inductor is attached to the metal output phase trace; and
    the metal output phase trace extends under the inductor.

13. The method of claim 12, wherein the metal ground trace extends under the inductor, and wherein the second discrete power stage transistor die is attached to both the metal ground trace and the metal output phase trace in a first region of the substrate disposed under the inductor.

14. The method of claim 13, wherein the metal input voltage trace extends under the inductor, and wherein the first discrete power stage transistor die is attached to both the metal input voltage trace and the metal output phase trace in a second region of the substrate disposed under the inductor.

15. The method of claim 14, wherein the inductor is attached to the first side of the substrate such that the metal ground trace, the metal input voltage trace and the metal output phase trace are each completely covered by the inductor.

16. The method of claim 7, wherein the main body of the inductor comprises a plastic riser which provides clearance under the inductor for accommodating at least one of the first and the second discrete power stage transistor dies.

17. The method of claim 1, wherein the inductor comprises separate uncoupled windings wound on the same core, and wherein each of the separate uncoupled windings electrically connects one output phase to the metal output trace.

18. The method of claim 1, wherein the first and the second discrete power stage transistor dies are bare, unpackaged dies each having a thickness of 0.6 mm or less.

19. The method of claim 1, wherein the first and the second discrete power stage transistor dies are packaged dies each having a thickness of 1.1 mm or less.

20. The method of claim 1, wherein the DC-DC converter is a multi-phase converter comprising a plurality of output phases, and wherein at least one discrete power stage transistor die of each output phase is partly covered by an inductor electrically connected to that output phase, the method further comprising:
    visually inspecting the plurality of pins of each output phase uncovered by the inductor.

21. The method of claim 20, wherein the plurality of output phases have an identical layout on the substrate.

22. The method of claim 1, wherein the first discrete power stage transistor die is a high-side power transistor die, wherein the second discrete power stage transistor die is a low-side power transistor die electrically connected to the high-side power transistor die to form the output phase of the DC-DC converter, and wherein the high-side power transistor die is partly covered by the inductor so that a plurality of pins of the high-side power transistor die are not covered by the inductor.

* * * * *